United States Patent [19]
Bazes

[11] Patent Number: 5,880,615
[45] Date of Patent: Mar. 9, 1999

[54] METHOD AND APPARATUS FOR DETECTING DIFFERENTIAL THRESHOLD LEVELS WHILE COMPENSATING FOR BASELINE WANDER

[75] Inventor: Mel Bazes, Haifa, Israel

[73] Assignee: Intel Corporation, Santa Clara, Calif.

[21] Appl. No.: 764,720

[22] Filed: Dec. 10, 1996

[51] Int. Cl.$^6$ .................................................... H03L 5/00
[52] U.S. Cl. ................................ 327/307; 327/37; 327/3
[58] Field of Search .................................. 327/3, 37, 40, 327/41, 47, 63, 65, 72, 74, 77, 82, 89, 90, 307, 538

[56] References Cited

U.S. PATENT DOCUMENTS

| | | | |
|---|---|---|---|
| 5,341,034 | 8/1994 | Matthews | 327/63 |
| 5,488,306 | 1/1996 | Bonaccio | 327/74 |

OTHER PUBLICATIONS

"DC Sensing Circuits Added," *Electronic Engineering Times*, p. 76, May 8, 1995.
T. Vafiades, "Baseline Wander and 100BASE–TX," Mar. 1995.
"Novel Transceiver Feedback Circuit Cures 100–Mbit Technology's Baseline Wander Woes," *Electronic Design*, p. 39, Jun. 12, 1995.

*Primary Examiner*—My-Trang Nu Ton
*Attorney, Agent, or Firm*—Blakely, Sokoloff, Taylor & Zafman LLP

[57] ABSTRACT

A method and an apparatus for detecting differential threshold levels of a differential signal being carried in first and second lines while compensating for baseline wander. In one embodiment, first and second single-ended signals and a common mode signal are generated in response to the first and second lines. First and second peak signals are then generated in response to the first and second single-ended signals and the common mode signal. Finally, first and second threshold signals are generated which are compared with the first and second single-ended signals to generate first and second output signals indicating first and second differential threshold levels.

30 Claims, 17 Drawing Sheets

METHOD AND APPARATUS FOR DETECTING DIFFERENTIAL THRESHOLD LEVELS WHILE COMPENSATING FOR BASELINE WANDER

BACKGROUND OF THE INVENTION

1. Field of the Invention

The present invention relates generally to data transmission technology and, more specifically, the present invention relates to the sensing of differential signals.

2. Description of the Related Art

Differential data communications signals rarely have 50% duty cycles. Therefore, their frequency spectrum generally includes a DC component. If differential data communications signal duty cycle varies continuously, as is usually the case, then the DC component also varies. If such a signal is sent through a medium which blocks the DC component, an undesirable phenomenon known as baseline wander occurs. If baseline wander is not compensated for, the phenomenon can cause increased bit error rate which results in a serious degradation in performance.

FIG. 1A illustrates a typical data communication medium 101 through which a DC signal component cannot pass. This medium includes a transmitter, modeled as a voltage source 103, a source impedance modeled as source resistors 105 and 107 having a resistance of $R_s/2$, a cable 109, an isolation transformer 111 and the receiver, modeled as load resistor $R_L$ 113. FIG. 1B illustrates the simplified equivalent circuit of the medium 151. The inductor L 153 which models the transformer inductance, shorts out any DC component and only allows AC components to pass through to $R_L$ 155. As a result, no DC signal component from the transmitter which includes voltage source 157 and source resistors 159 and 161, can pass through medium 151.

FIG. 2 illustrates baseline wander for the case of a differential signal, i.e., a signal not referenced to ground, that is transmitted through the circuits 101 and 151 of FIGS. 1A and 1B respectively. As shown in FIG. 2, the baseline 205 of the input signal IN 201 is constant at 0 volts. In contrast, the baseline 205 of the output signal OUT 203 decreases asymptotically from 0 volts to a negative value.

In general, the baseline asymptote of a differential signal having a constant duty cycle D is given by Equation 1 below.

$$V_{BASE} = \frac{V_{P-P}}{2}(1-2D) \quad \text{(Equation 1)}$$

$V_{BASE}$ is the baseline voltage and $V_{P-P}$ is the peak-to-peak differential amplitude of the signal.

In the example in FIG. 2, D equals 0.75. Thus, the baseline asymptote equals $-V_{P-P}/4$ in accordance with Equation 1 above. It is noted, however, that the duty cycle generally varies continuously so that the baseline 205 varies or wanders continuously.

A device that receives a differential signal such as OUT 203 converts the differential signal to a logic signal for subsequent processing using a comparator whose threshold is set midway between the two levels of the received signal. With the threshold set in this fashion, the receiver noise margin is maximized. If the baseline wanders, however, then the difference between the peak voltage of the received signal and the comparator threshold is no longer constant, but, rather, also varies along with the baseline. As the peak voltage varies, the comparator switches at different times with respect to the locations of transitions in the received signal. This introduces jitter that reduces timing margins in the clock and data recovery circuit that follows the comparator. The reduction in timing margin causes an increase in the bit error rate.

FIG. 3 shows a block diagram 301 of one prior art circuit used to compensate for baseline wander. As shown in FIG. 3, an input signal 303 that includes a wandering DC level is received by a DC level adjuster 305. The output of DC level adjuster 305 is received by adaptive equalizer 307 which generates an output 309 of serial data. A "theoretical" waveform is created with block 311 from output 309 and is compared with block 313 which generates a DC error received by integrator 315. Integrator 315 generates an amplified DC error which is received by the DC level adjuster 305.

The prior art circuit shown in FIG. 3 measures the DC offset voltage that builds up due to asymmetrical data on differential signal networks. Circuit 301 overcomes baseline wander by shifting, in real time, the DC level of the incoming signal 303 back to its original level. To measure the amount of DC offset present in the received input waveform 303, processing block 311 creates the "theoretical" waveform of what the incoming signal should look like if there were no offset. This ideal "theoretical" signal is compared with the incoming waveform to detect the amount of offset present. The offset is then nullified with the aid of the built-in DC level adjuster 305. Adaptive equalizer 307 compensates for the effects of phase distortions induced by the impedance characteristics of the wire used to carry the signals. The length of the wire is determined and the equalizer tunes its equalization curve to counteract the attenuation characteristics for the specific length of the wire.

A problem with the prior art techniques such as the circuit shown in FIG. 3 is that the techniques rely on active negative feedback coupled with precision amplitude control in order to achieve accurate baseline wander compensation. The requirement of feedback and precision control results in the prior art techniques being difficult and complex to implement.

Therefore, what is desired is a method and an apparatus for sensing differential threshold levels in differential signals while compensating for baseline wander without the need for feedback or precision amplitude control. Such a method and apparatus should be readily implemented in circuitry less complex than the prior art methods discussed above.

SUMMARY OF THE INVENTION

A method and an apparatus for detecting differential threshold levels of a differential signal being carried in first and second lines is disclosed. In one embodiment, a first peak detector circuit is coupled to the first and second lines and detects first and second peak voltages in the differential signal. The first peak detector generates resulting first and second peak signals. A resistor network/comparator circuit is coupled to the first and second lines and the first and second peak signals. The resistor network/comparator circuit generates a first output signal indicating a first differential threshold level of the differential signal. Additional features and benefits of the present invention will become apparent from the detailed description, figures and claims set forth below.

BRIEF DESCRIPTION OF THE DRAWINGS

The present invention is illustrated by way of example and not limitation in the accompanying figures.

DETAILED DESCRIPTION

A method and an apparatus for detecting differential threshold levels of a differential signal while compensating for baseline wander is disclosed. In the following description numerous specific details are set forth in order to provide a thorough understanding of the present invention. It will be apparent, however, to one having ordinary skill in the art that the specific detail need not be employed to practice the present invention. In other instances, well known materials or methods have not been described in detail in order to avoid obscuring the present invention.

Figure 1A:
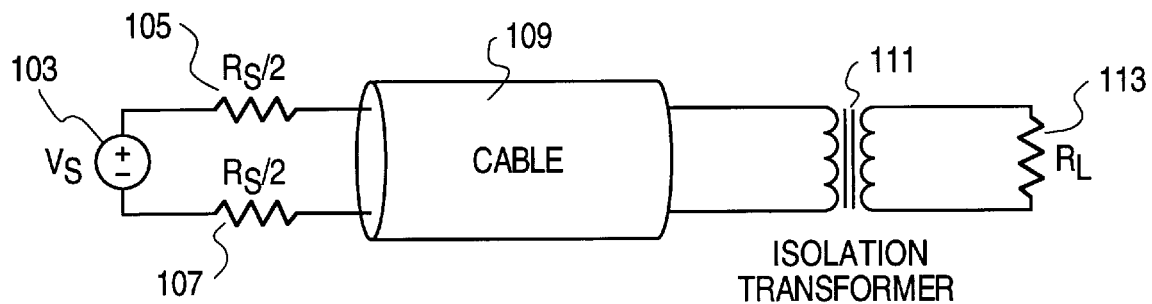
FIG. 1A is an illustration showing a typical prior art data communication medium.
Figure 1B:
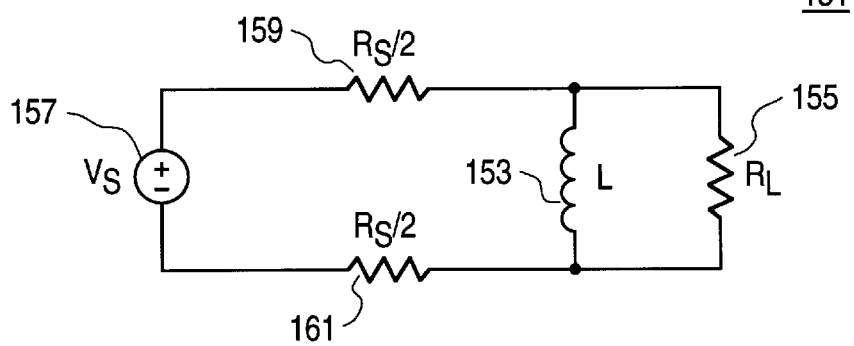
FIG. 1B is an illustration of a simplified equivalent circuit of a prior art data communication medium.
Figure 2:
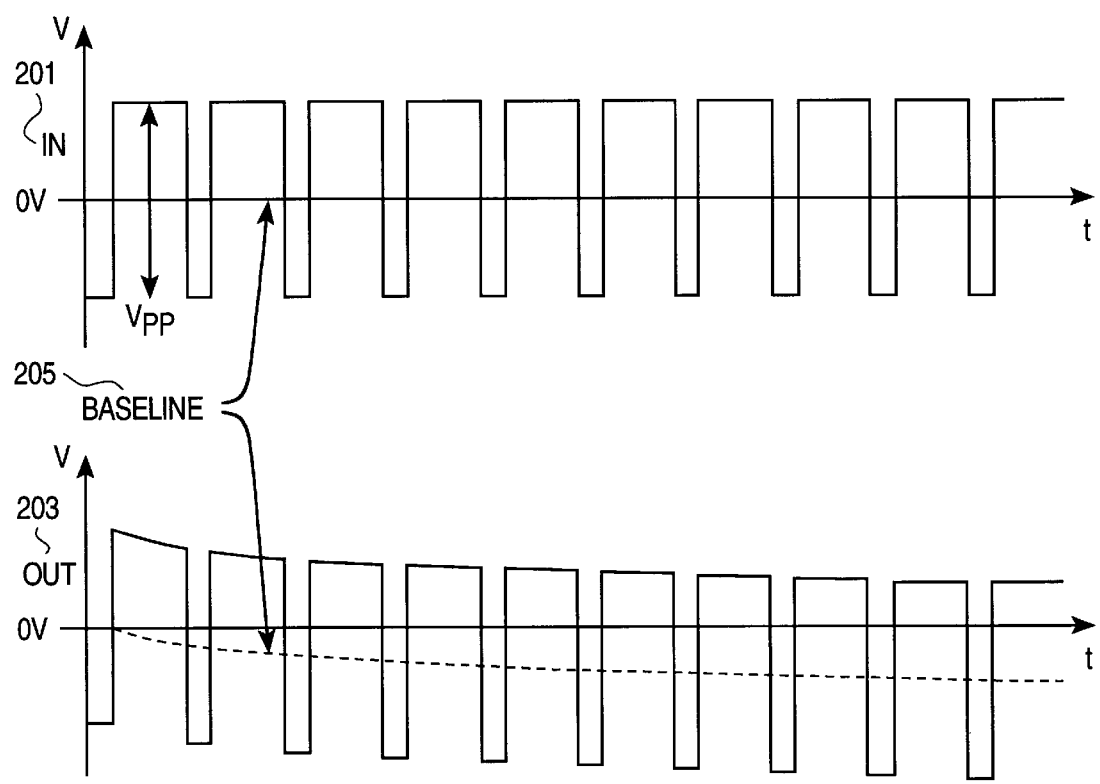
FIG. 2 is a plot illustrating baseline wander for the case of a differential signal.
Figure 3:
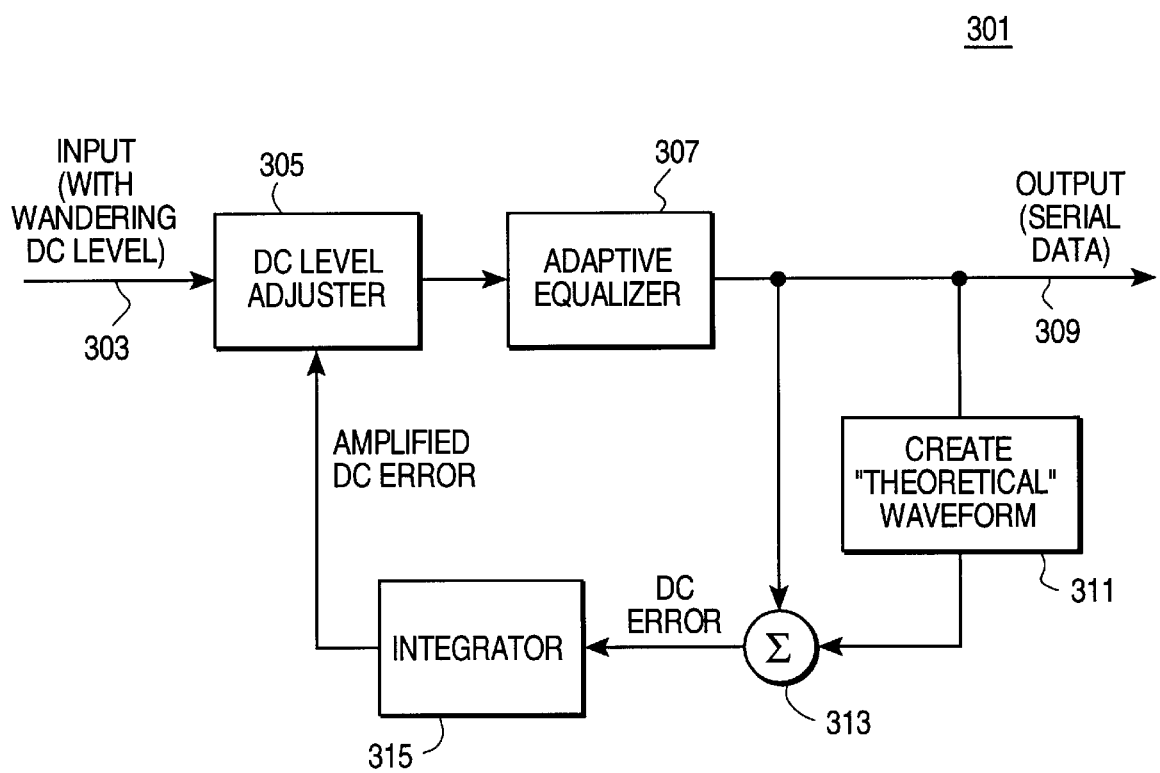
FIG. 3 is a block diagram of a prior art circuit used to compensate for baseline wander.
Figure 4:
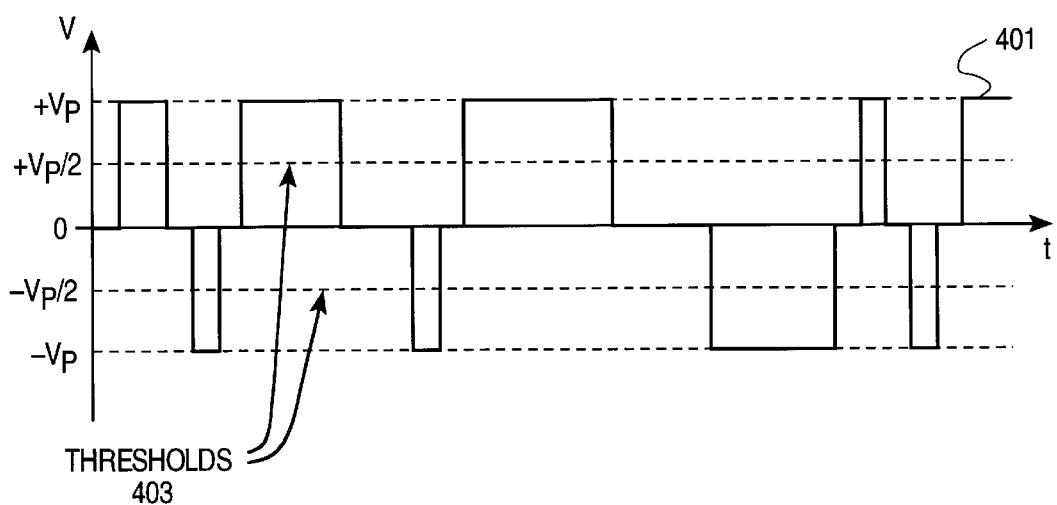
FIG. 4 is an illustration of a plot of a three-level differential signal and the corresponding differential threshold voltages.

FIG. 4 illustrates how differential threshold voltages 403 are set for an example of a three-level signal 401 such as an MLT-3 which is the signaling method used in 100 BASE-TX Ethernet. Neglecting for the time-being the effects of baseline wander, three-level signal 401 makes transitions between the differential voltage levels $+V_p$, 0 volts and $-V_p$, where $V_p$ is the peak differential amplitude of signal 401. Since signal 401 has three levels, two comparators are used to detect transitions between these levels. One of the comparators would have its differential threshold set at $+V_p/2$, which is exactly midway between the $+V_p$ and 0 volt levels, and would detect all transitions between $+V_p$ and 0 volts. The other comparator would have its differential threshold set at $-V_p/2$, which is exactly midway between the $-V_p$ and 0 volt levels and would detect all transitions between $-V_p$ and 0 volts. Setting the thresholds exactly midway between voltage levels maximizes tolerance to interference such as jitter, signal distortion and noise. It is noted that the thresholds are differential thresholds voltages between two signal lines and not threshold voltages referenced to ground.

Figure 5:
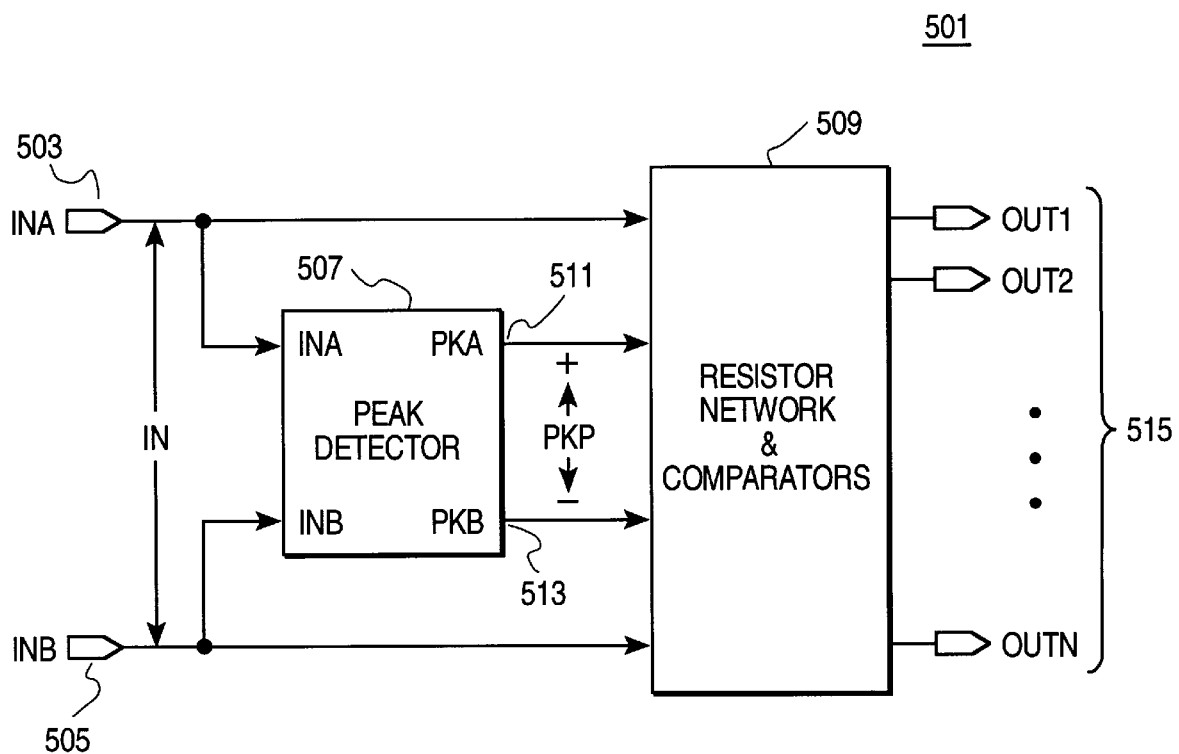
FIG. 5 is a block diagram of a differential-to-single-ended converter circuit in accordance with the teachings of the present invention.

FIG. 5 is a block diagram of a simple differential-to-single-ended converter 501 which detects transitions in a multi-level differential signal such as signal 401 shown in FIG. 4. Converter 501 utilizes comparators to compare the input differential voltage to differential voltage thresholds set midway between the signal levels. In one embodiment of the present invention, the comparators output a two level logic signal—high or low—that is referenced to ground. It is noted that the particular embodiment of the present invention shown in FIG. 5 is not capable of compensating for baseline wander.

As shown in FIG. 5, a differential signal IN is input between inputs INA 503 and INB 505. Peak detector 507 receives INA 503 and INB 505 and generates a DC differential voltage with an amplitude equal to that of differential signal IN at output pins PKA 511 and PKB 513. If it is assumed that no baseline wander occurs in differential signal IN, the peak negative amplitude of the differential signal IN is exactly equal to the peak positive amplitude. As will be discussed, this assumption is in general incorrect and will be addressed in further detail below.

Resistor network and comparators block 509 receives four input signals INA 503, INB 505, PKA 511 and PKB 513 to generate single-ended outputs OUT1-N 515. Outputs 515 are referenced to ground. The number of outputs depends on the number of voltage levels defined in the input IN. If the number of voltage levels is $N_L$, then the number of outputs equals $N_L-1$. The smallest number of levels in a signal is two. Accordingly, the smallest number of outputs 515 is one. In the example of the three-level signal 401 of FIG. 4, $N_L=3$, so that $N_L-1=2$ comparators are required.

Figure 6:
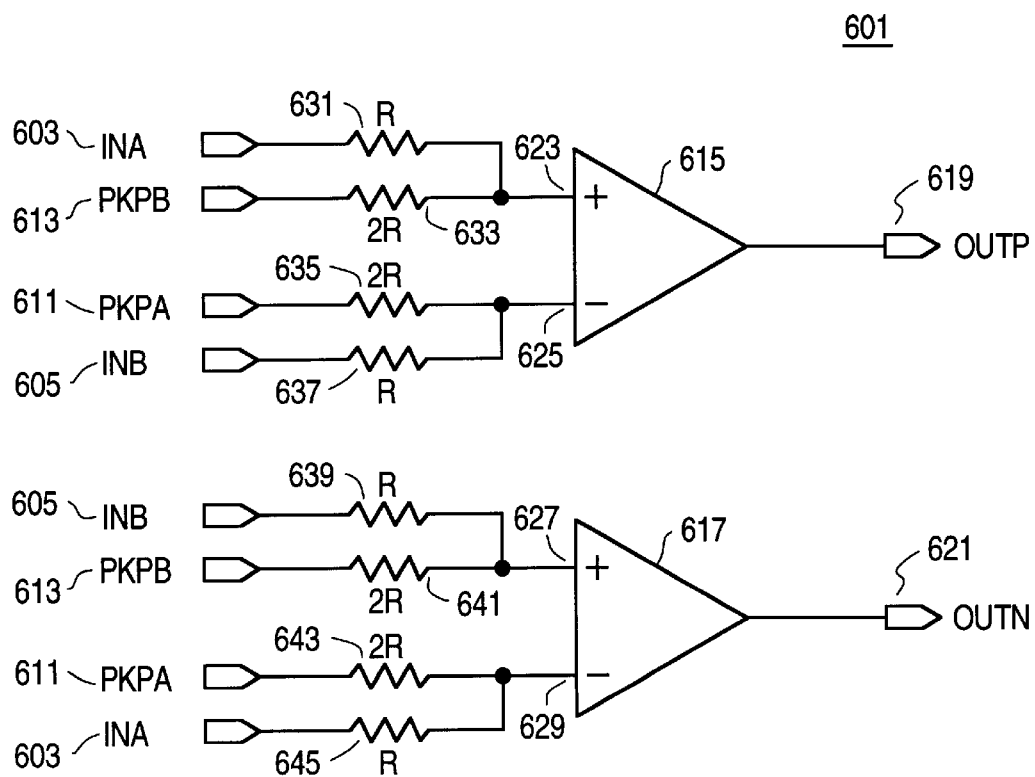
FIG. 6 is an illustration of a circuit schematic of a resistor network and comparators for the differential-to-single-ended converters in accordance of the teachings of the present invention.

FIG. 6 illustrates a circuit schematic 601 of the resistor network and comparators block 509 of FIG. 5 for one embodiment of the present invention employing a three-level signal such as signal 401 in FIG. 4. INA 603 is received by the positive input 623 of comparator 615 through resistor 631 having a resistance of R. PKPB 613 is received at positive input 623 through resistor 633 having resistance of 2R. PKPA 611 is received at the negative input 625 of comparator 615 through resistor 635 having a resistance of 2R. INB 605 is also received at negative input 625 through resistor 637 having a resistance of R. Comparator 615 generates output signal OUTP 619. INB 605 is also received at the positive input 627 of comparator 617 through resistor 639 having a resistance of R. PKPB 613 is also received at the positive input 627 of comparator 617 through resistor 641 having a resistance of 2R. PKPA 611 is also received at the negative input 629 of comparator 617 through resistor 643 having a resistance of 2R. INA 603 is also received at the negative input 629 of comparator 617 through resistor 645 having a resistance of R. Comparator 617 generates output signal OUTN 621.

Analysis of circuit 601 shows that signal OUTP 619 goes high when $$VINA - VINB \equiv VIN \geq \frac{VPKPA - VPKPB}{2} \equiv \frac{VPKP}{2} \quad \text{(Equation 2)}$$

where VINA and VINB are the voltages referenced to ground at inputs INA 603 and INB 605, VIN is the differential voltage between inputs INA 603 and INB 605, VPKPA and VPKPB are the voltages referenced to ground at peak detectors outputs PKA 511 and PKB 513 of FIG. 5, and VPKP is the differential voltage between peak detector 507 outputs PKA 511 and PKB 513. The analysis further shows that OUTN 621 goes high when $$VINA - VINB \equiv VIN \leq \frac{VPKPB - VPKPA}{2} \equiv -\frac{VPKP}{2} \quad \text{(Equation 3)}$$

Note that Equations 2 and 3 above are completely independent of the resistor values of resistors 631, 633, 635, 637, 639, 641, 643 and 645 of circuit 601. This is because circuit 601 depends only on the resistor ratios and not on the resistor values themselves. It is appreciated that resistor ratios can be implemented with high accuracy in VLSI technologies.

As noted above, circuits 501 and 601 of FIGS. 5 and 6 operate correctly as long as no baseline wander takes place. If there is baseline wander, however, circuits 501 and 601 no longer operate correctly as will be shown below.

Figure 7:
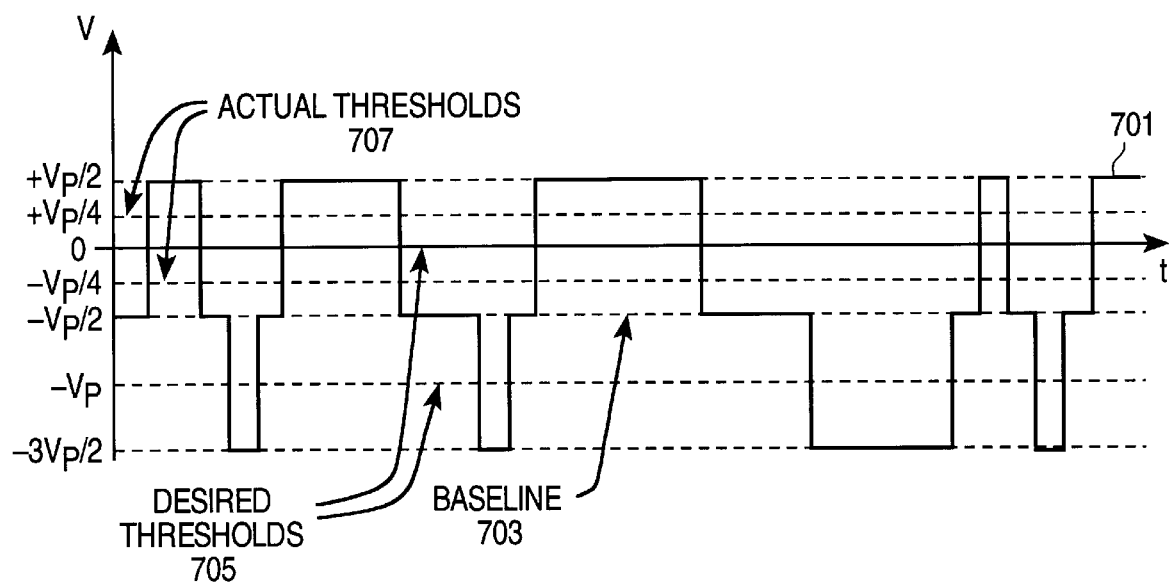
FIG. 7 is a plot of a three-level signal whose baseline has been shifted down hypothetically by $V_p/2$.

FIG. 7 illustrates a three-level signal 701 whose baseline 703 has been shifted down hypothetically by $V_p/2$. In this situation, circuits 501 and 601 of FIGS. 5 and 6 would generate actual threshold 707 at $\pm V_p/4$.

However, the desired thresholds 705 as shown in FIG. 7 would be at 0 volts and $-V_p$ instead. Accordingly, circuits 501 and 601 do not operate correctly in the presence of baseline wander.

Figure 8:
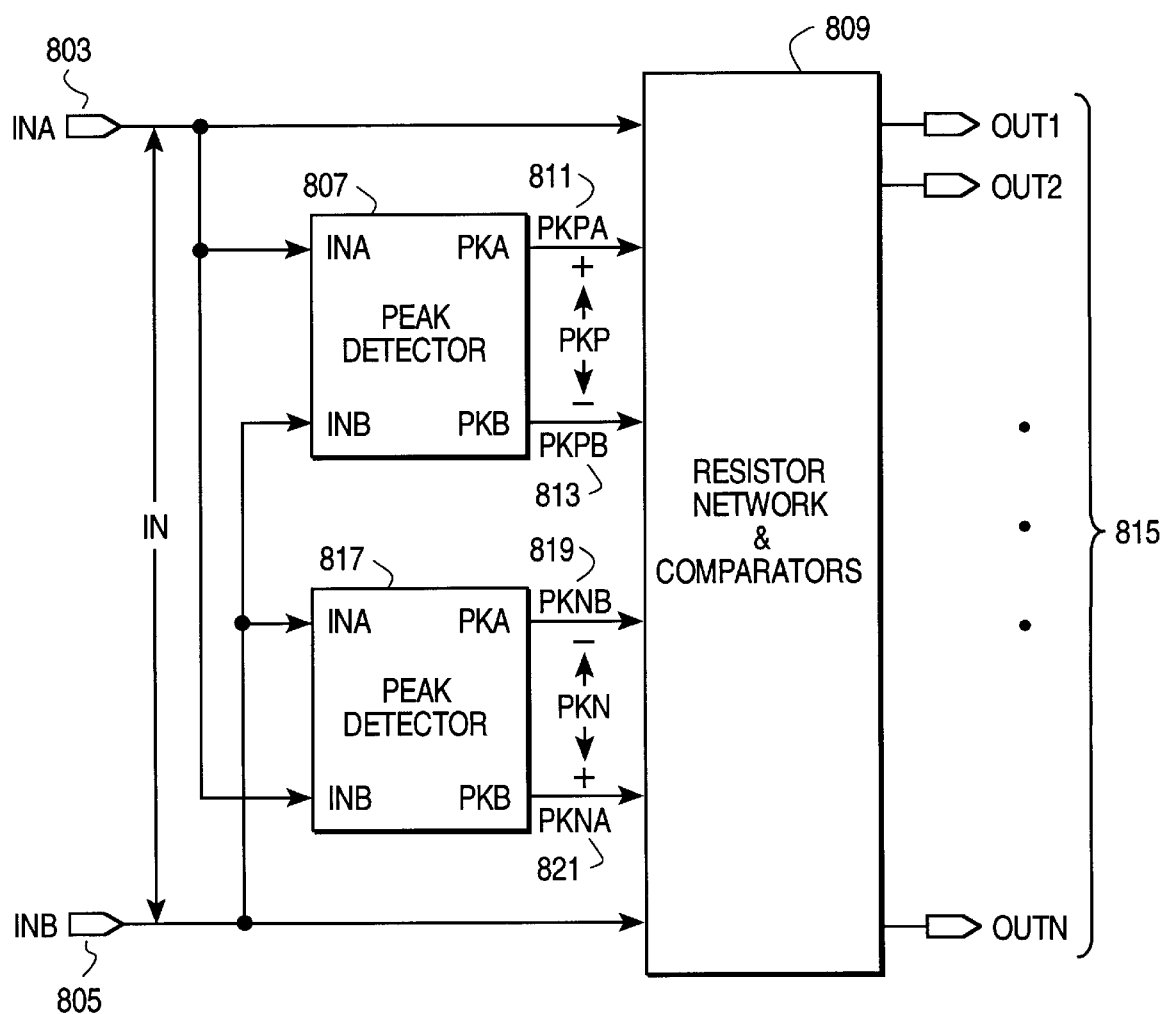
FIG. 8 is a block diagram of another embodiment of a differential-to-single-ended converter with baseline compensation in accordance with the teachings of the present invention.

FIG. 8 illustrates a block diagram of another embodiment of a differential-to-single-ended converter 801 which provides baseline wander compensation. Instead of only a single peak detector 507 such as differential-to-single-ended converter 501 of FIG. 5, the embodiment shown in FIG. 8 includes two peak detectors 807 and 817. Peak detectors 807 and 817 and resistor network and comparators block 809 are coupled to receive differential signal IN inputs INA 803 and INB 805. Peak detector 807 generates output signals PKPA 811 and PKPB 813 which are received by resistor network and comparators block 809. Peak detector 817 generates outputs PKNB 819 and PKNA 821 which are also received by resistor network and comparators block 809. Output signals OUT1-N 815 are generated by resistor network and comparators block 809.

Peak detector 807 outputs and tracks the peak positive amplitude of the input signal IN, while peak detector 817 outputs and tracks the peak negative amplitude of input signal IN. With the definitions used for PKP and PKN in FIG. 8, the differential output of peak detector 807 can have values of 0 volts or more (i.e. it only outputs positive differential voltages), while the differential outputs of peak detector 817 can only have values of 0 volts or less (i.e. it only outputs negative differential voltages).

To illustrate, assume that the baseline of differential signal IN wanders and decreases by ΔV. Then the differential output of peak detector 807 decreases by ΔV, i.e. becomes less positive and smaller in absolute value, while the differential output of the lower peak detector also decreases by ΔV, i.e. becomes more negative and larger in absolute value. The resistor network and comparators block 809 then combine the six input signals, INA 803, INB 805, PKPA 811, PKPB 813, PKNA 821 and PKNB 819 to generate single-ended outputs OUT1-N 815.

The threshold voltages for the comparators of resistor network and comparators block 809 are generated from the peak detector outputs 811, 813, 819 and 821 as follows. Those comparators whose thresholds are positive with an unshifted baseline have their threshold generated according to Equation 4 below:

$$V_{THP} = \left(\frac{1+f}{2}\right) VPKP + \left(\frac{1-f}{2}\right) VPKN \quad \text{(Equation 4)}$$

where f is the fraction of the peak amplitude at which the threshold would be set with no baseline shift. Note that VPKP≧0 and VPKN≦0 always. Those comparators whose thresholds are negative with an unshifted baseline have their threshold generated according to Equation 5 below:

$$V_{THN} = \left(\frac{1+f}{2}\right) VPKN + \left(\frac{1-f}{2}\right) VPKP \quad \text{(Equation 5)}$$

Finally, a comparator which has a threshold of 0 volts with an unshifted baseline has its threshold generated according to Equation 6 below:

$$V_{TH0} = \frac{VPKP + VPKN}{2} \quad \text{(Equation 6)}$$

It is noted that both Equations 4 and 5 result in Equation 6 when f=0.

To illustrate how the thresholds specified by Equations 4–6 above compensate for baseline wander, these Equations may be applied to signal 701 of FIG. 7. In FIG. 7, f=½ for both thresholds. The desired positive threshold is found from Equation 4 to be given by $$V_{THP}=(¾)VPKP+(¼)VPKN=(¾)(V_p/2)+(¼)(-3V_p/2)=0$$
(Equation 7)

which is exactly the desired positive threshold shown in FIG. 7. The desired negative threshold is found from Equation 5 to be given by $$V_{THN}=(¾)VPKN+(¼)VPKP=(¾)(-3V_p/2)+(¼)(V_p/2)=-V_p$$
(Equation 8)

which is exactly the desired negative threshold shown in FIG. 7.

Figure 9:
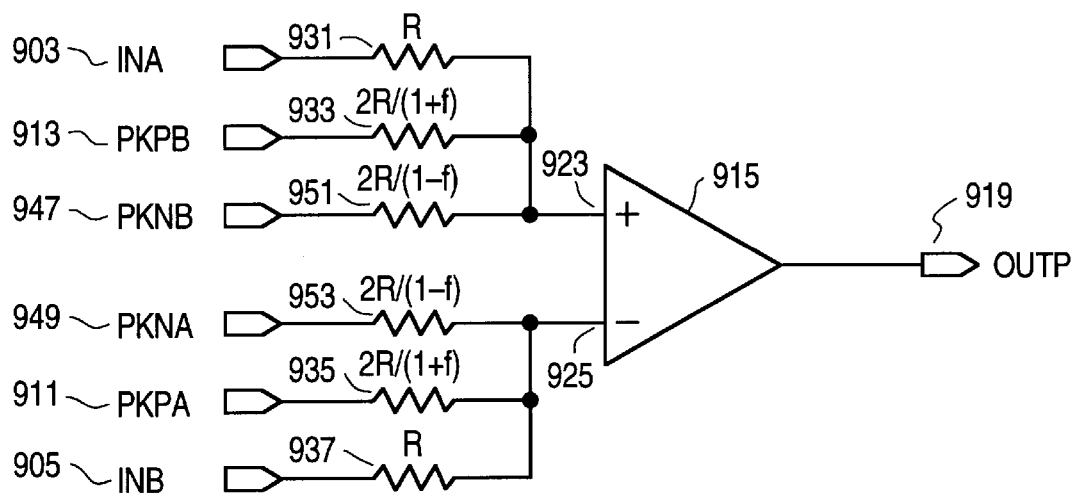
FIG. 9 is a circuit schematic of another embodiment of a differential-to-single-ended converter in accordance with the teachings of the present invention.
Figure 9:
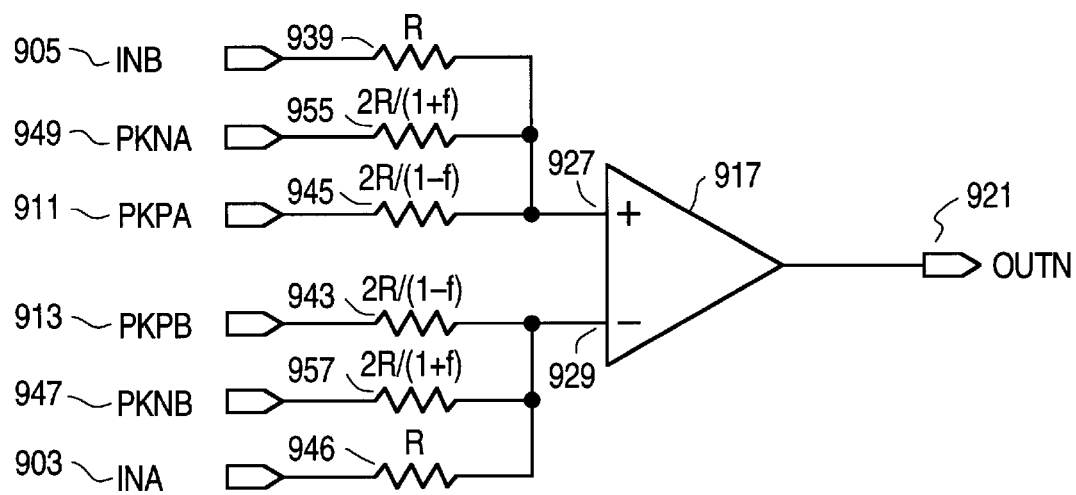

FIG. 9 shows one embodiment of a circuit schematic 901 of the resistor network and comparators block 809 which corresponds to generic Equations 4–6 above. INA 903, PKPB 913 and PKNB 947 are received by the positive input 923 of comparator 915 through resistors 931, 933 and 951 respectively. Resistors 931, 933 and 951 have resistances of R, 2R/(1+f), and 2R/(1-f) respectively. PKNA 949, PKPA 911 and INB 905 are received by the negative input 925 of comparator 915 through resistors 953, 935 and 937 respectively. Resistors 953, 935 and 937 have resistances of 2R/(1-f), 2R/(1+f) and R respectively. INB 905, PKNA 949 and PKPA 911 are received by the positive input 927 of comparator 917 through resistors 939, 955 and 945 respectively. Resistors 939, 955 and 945 have resistances of R, 2R/(1+f) and 2R/(1-f) respectively. PKPB 913, PKNB 947 and INA 903 are received by the negative input 929 of comparator 917 through resistors 943, 957 and 946 respectively. Resistors 943, 957 and 946 have resistances of 2R/(1-f), 2R/(1+f) and R respectively. As shown in FIG. 9, comparator 915 generates output signal OUTP 919 and comparator 917 generates output signal OUTN 921.

It is appreciated that the circuitry that generates OUTP 919 is applicable for all positive thresholds and to a threshold of 0 volts and is not limited only to a single output. Similarly, the circuitry that generates OUTN 921 is applicable for all negative differential thresholds and to a threshold of 0 volts and is not limited only to a single output. The only difference between the circuitry of each threshold is the fraction f, which is different for each threshold.

Figure 10:
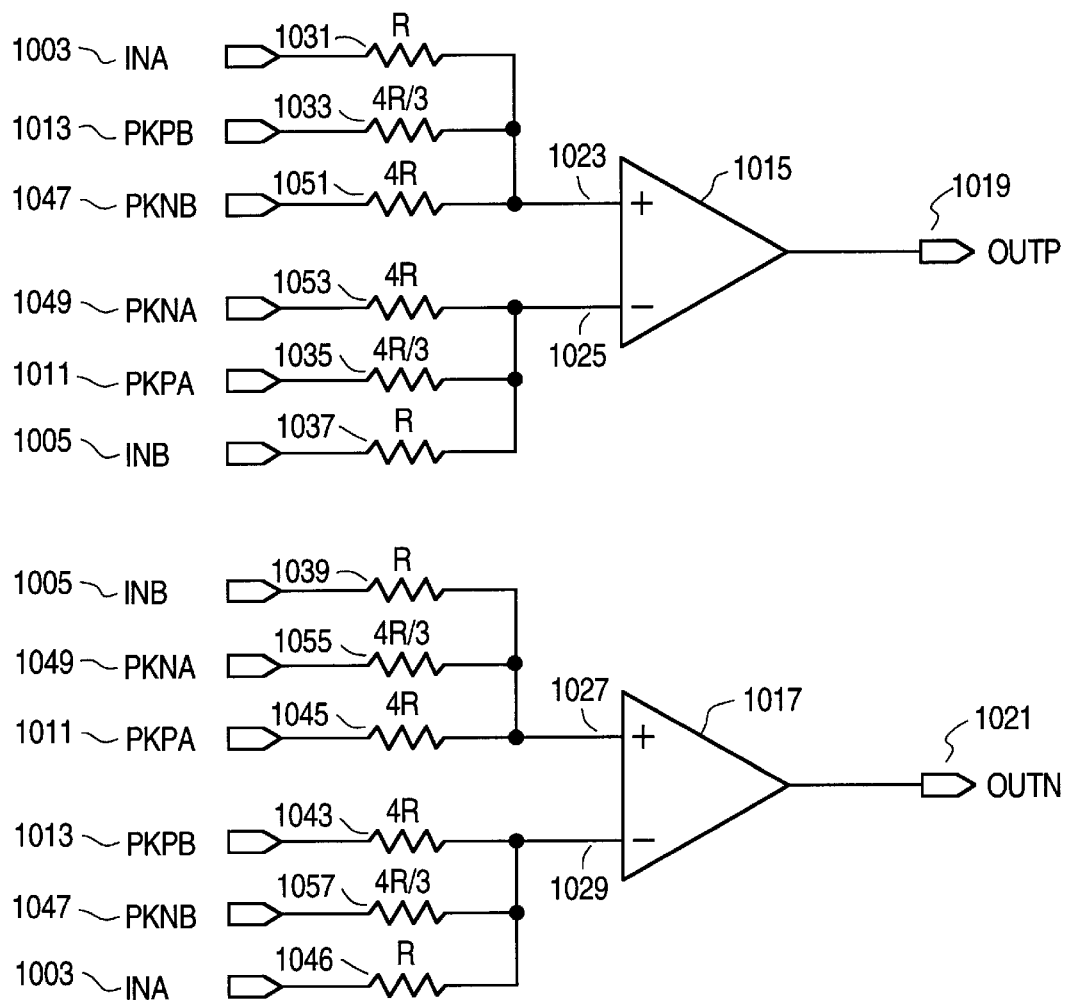
FIG. 10 is a circuit schematic of yet another embodiment of a differential-to-single-ended converter in accordance with the teachings of the present invention.

FIG. 10 is a circuit schematic 1001 of a differential-to-single-ended converter for one specific embodiment of the present invention to be utilized with a three-level signal (N=3) such as signal 701 of FIG. 7 with f=½ for both thresholds as discussed in connection with Equations 4 and 5 above. Circuit 1001 corresponds exactly with circuit 901 such that resistors 1031, 1033, 1051, 1053, 1035, 1037, 1039, 1055, 1045, 1043, 1057 and 1046 of circuit 1001 correspond with resistors 931, 933, 951, 953, 935, 937, 939, 955, 945, 943, 957 and 946 of circuit 901 respectively. With f=½ in the embodiment shown, resistors 1031, 1033, 1051, 1053, 1035, 1037, 1039, 1055,1045,1043,1057, and 1046 have resistances of R, 4R/3, 4R, 4R, 4R/3, R, R, 4R/3, 4R, 4R, 4R/3 and R respectively as shown in FIG. 10.

As discussed above, circuit schematic 1001 may be modified accordingly to accommodate differential signals with N equal to values other than three. It is noted that in some instances, N may be equal to an even number. In such instances, there will be a threshold level at zero volts. It is appreciated that a person having ordinary skill of the art could include circuitry to detect a threshold level corresponding to zero volts in accordance with Equation 6 above.

Figure 11:
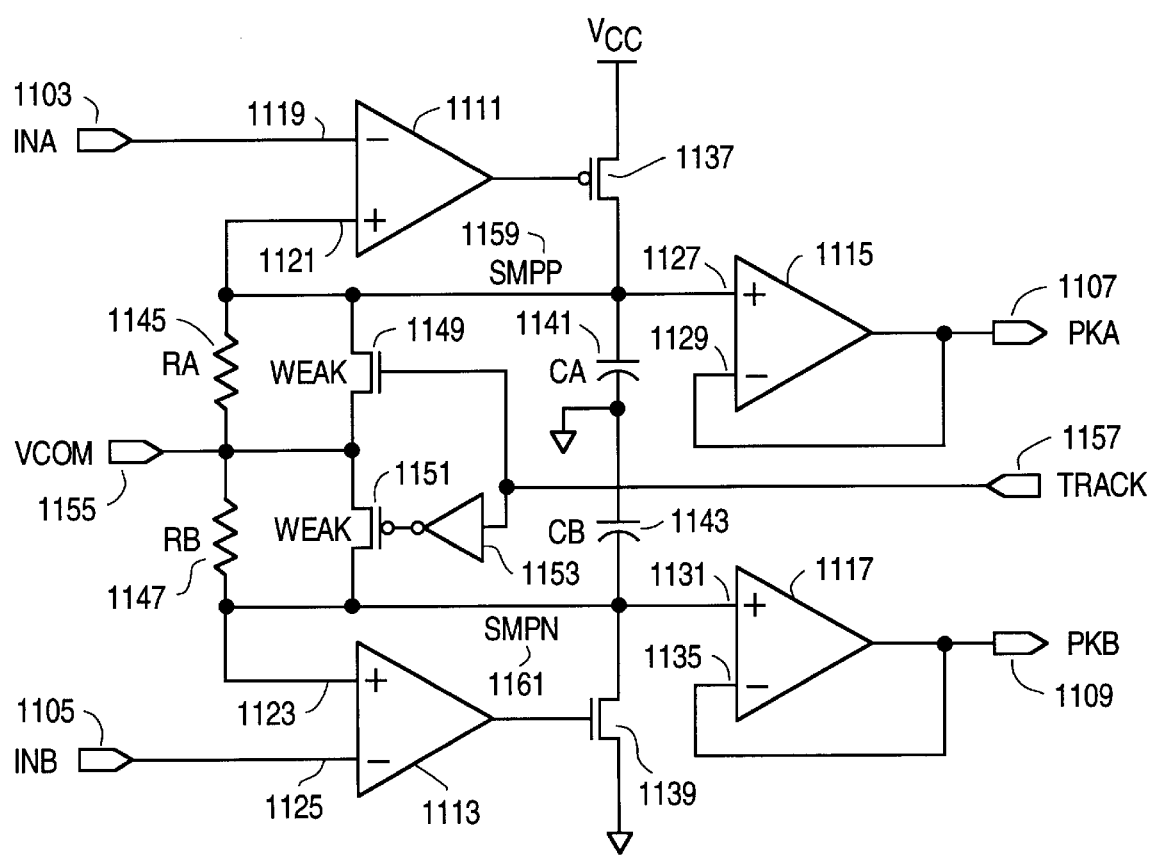
FIG. 11 is a circuit schematic of one embodiment of a peak detector in accordance with the teachings of the present invention.

FIG. 11 illustrates a simplified schematic 1101 of one embodiment of the peak detector 807 or 817 used in the present invention. Circuit 1101 includes comparator 1111 coupled to receive INA 1103 at negative input 1119. Comparator 1113 is configured to receive INB 1105 at its negative input 1125. Voltage VCOM 1155 is coupled to be received at the positive inputs 1121 and 1123 of comparators 1111 and 1113 respectively through resistors RA 1145 and RB 1147 respectively. In one embodiment of the present invention, VCOM 1155 is an intermediate voltage nominally equal to $V_{cc}/2$. N-channel transistor 1149 and p-channel transistor 1151 are coupled between the positive inputs 1121 and 1123 of comparators 1111 and 1113 respectively as shown in FIG. 11. The gate of n-channel transistor 1149 is coupled to TRACK 1157. The gate of p-channel transistor 1151 is also coupled to TRACK 1157 through inverter 1153.

One pin of capacitor CA 1141 is coupled to VCC through p-channel transistor 1137 while the other pin of capacitor CA 1141 is grounded. One pin of capacitor CB 1143 is coupled to ground through n-channel transistor 1139 while the other pin of capacitor CB 1143 is grounded. P-channel transistor 1137 is activated in response to an output of comparator 1111 and n-channel transistor 1139 is activated in response to an output of comparator 1113. The positive input 1127 of operational amplifier 1115 is coupled to node SMPP 1159 and the positive input 1131 of operational amplifier 1117 is coupled to node SMPN 1161. Operational amplifiers 1115 and 1117 are configured as voltage followers to buffer the voltages on nodes SMPP 1159 and SMPN 1161 with output signal PKA 1107 coupled to negative input 1129 of operational amplifier 1115 and output signal PKB 1109 coupled to negative input 1135 of operational amplifier 1117. Accordingly, outputs PKA 1107 and PKB 1109 output the voltages on nodes SMPP 1159 and SMPN 1161 after being buffered by voltage follower configured operational amplifiers 1115 and 1117 respectively.

Operation of circuit 1101 is as follows. Input signal INA 1103 is compared with the voltage on node SMPP 1159 using comparator 1111. If the voltage on INA 1103 is less than the voltage on node SMPP 1159, the p-channel transistor 1137 is switched off and the voltage on capacitor CA 1141 is maintained. However, if the voltage on INA 1103 exceeds the voltage on SMPP 1159, p-channel transistor 1137 is switched on and capacitor CA 1141 is charged up until the difference between the voltages on INA 1103 and node SMPP 1159 is zero. At this time, the charging of capacitor CA 1141 is discontinued. Thus, the voltage output on PKA 1107 equals the highest (peak) voltage that appears on INA 1103.

PKB 1109 is generated in the same manner as PKA 1107 but with opposite polarity. That is, if the voltage on INB 1105 exceeds the voltage on node SMPN 1161, n-channel transistor 1139 is switched off and the charge on capacitor CB 1143 is maintained. However, if the voltage on INB 1105 is less than the voltage on node SMPN 1161, n-channel transistor 1139 is switched on and capacitor CB 1143 is discharged until the difference between the voltages on INB 1105 and node SMPN 1161 is zero, at which time the discharge of capacitor CB 1143 is discontinued. Thus, the voltage output on PKB 1109 equals the lowest (peak) voltage that appears on INB 1105. The difference between the voltages on PKA 1107 and PKB 1109 is therefore the peak differential voltage that appears between inputs INA 1103 and INB 1105.

Resistors RA 1145 and RB 1147 slowly discharge capacitors CA 1141 and CB 1143 respectively so that the peak detectors can track slow changes in the peak voltages. Nodes SMPP 1159 and SMPN 1161 are slowly discharged to voltage the VCOM 1155, which as described above is an intermediate voltage nominally equal to $V_{cc}/2$. The time constant created by resistors RA 1145 and RB 1147 with capacitors CA 1141 and CB 1143 are short enough in one embodiment of the present invention to track the change in peak differential voltage caused by baseline wander.

In one embodiment of the present invention, the time constant described above may be under control of the differential-to-single-ended converter outputs. The peak detector which outputs PKA 1107 would have a long time constant as long as all the outputs with positive thresholds are low. When any of these outputs goes high, the time constant would be reduced to a low value in order to allow a rapid tracking of baseline wander. This would be accomplished using the TRACK signal 1157, which would be activated by the output having the lowest positive threshold. When TRACK 1157 is activated, weak n-channel transistor 1149 and weak p-channel transistor 1151 are turned on in parallel with resistors RA 1145 and RB 1147 to reduce the effective time constant of the peak detector to a low value in order to allow a rapid tracking of baseline wander. Likewise, the peak detector which outputs PKB 1109 would have a long time constant as long as all the outputs with negative thresholds are low. When any of those outputs goes high, the time constant of the peak detector that outputs PKB 1109 would be reduced to a low value in order to allow rapid tracking of baseline wander through the TRACK input 1157. However, for this peak detector TRACK 1157 would be activated by the output having the lowest negative threshold.

Thus, peak detector circuit 1101 can be viewed as including capacitors CA 1141 and CB 1143 with corresponding charge/discharge circuitry. The charge/discharge circuitry of peak detector circuit 1101 charges and/or discharges the nodes SMPP 1159 and SMPN 1161 in order to output the peaks of input signals INA 1103 and INB 1105 at PKA 1107 and PKB 1109 respectively.

Referring back to circuits 901 and 1001 of FIGS. 9 and 10 respectively, it is appreciated that an inherent 50% attenuation in the signal amplitude occurs at the comparator inputs of each respective circuit. This may be illustrated by calculating the voltages at the inputs to the comparators in the embodiment shown in FIG. 10. For comparator 1015, the voltages at the positive input 1023 is given by Equation 9 below:

$$V_+ = \frac{1}{2} VINA + \frac{3}{8} VPKPB + \frac{1}{8} VPKNB \quad \text{(Equation 9)}$$

The voltage at the negative input 1025 of comparator 1015 is given by Equation 10 below:

$$V_- = \frac{1}{2} VINB + \frac{3}{8} VPKPA + \frac{1}{8} VPKNA \quad \text{(Equation 10)}$$

VINA is the voltage at INA 1003, VINB is the voltage at INB 1005, VPKPA is the voltage at PKPA 1011, VPKPB is the voltage at PKPB 1013, VPKNA is the voltage at PKNA 1049 and VPKNB is the voltage at PKNB 1047. From Equations 9–10 above, the voltages VINA and VINB are attenuated by ½, which is 50% or 6 dB at the inputs to comparator 1015. It is appreciated that the same analysis performed on comparator 1017 shows the same attenuation for INA 1003 and INB 1005.

The 50% signal level attenuation constitutes a serious drawback since it reduces the signal-to-noise ratio by 50%. Since noise interference generally is a problem that must be reduced as much as possible, the 50% signal level attenuation is undesirable.

Figure 12:
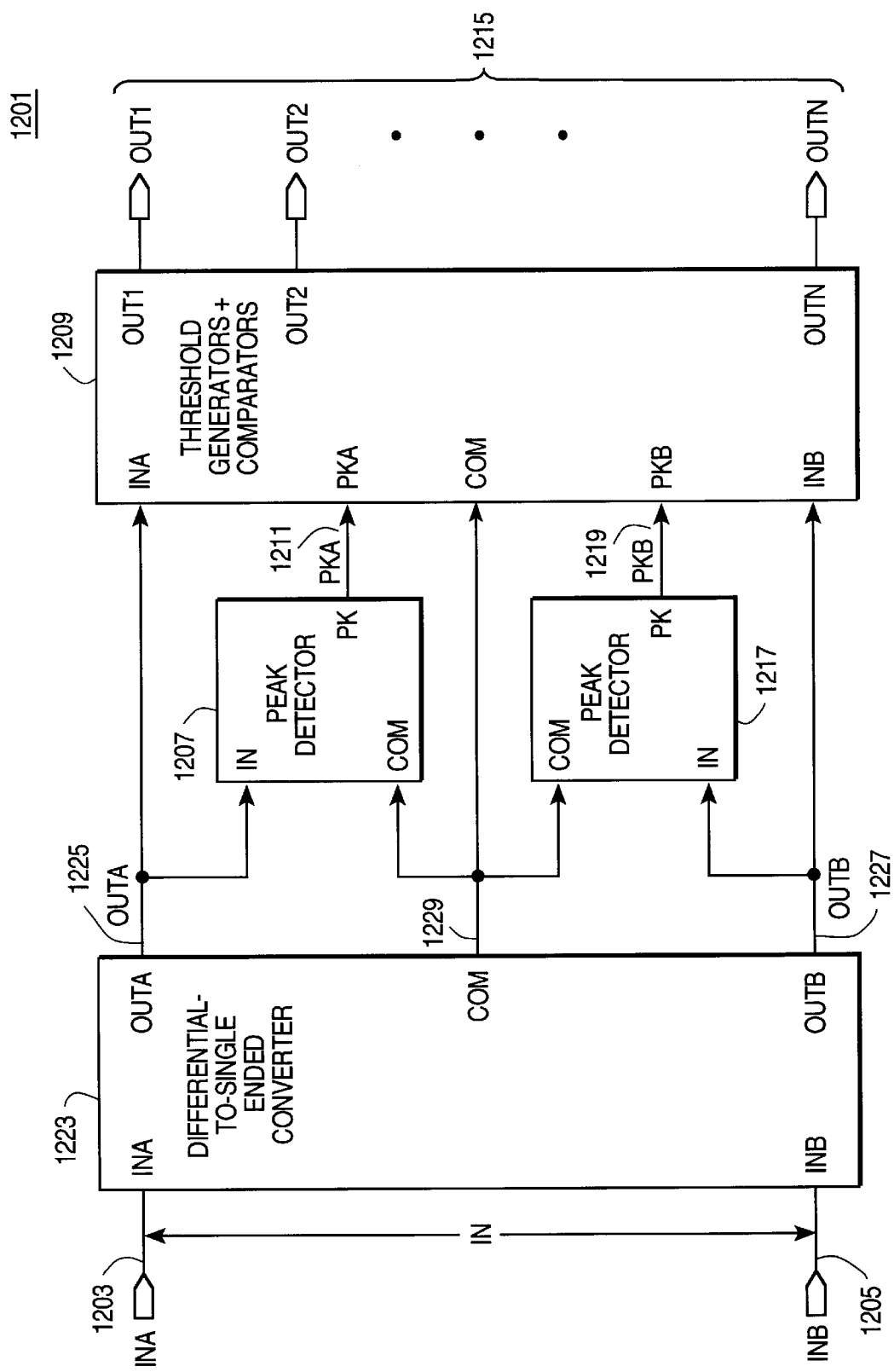
FIG. 12 is a block diagram of a baseline wander compensation circuit in accordance with the teachings of the present invention.

FIG. 12 is a block diagram of another embodiment of baseline wander compensation circuit 1201 in accordance with the teachings of the present invention. A differential signal IN is input between INA 1203 and INB 1205 to the differential-to-single-ended converter 1223. Differential-to-single-ended converter 1223 generates output signals OUTA 1225, OUTB 1227 and COM 1229. As shown in FIG. 12, OUTA 1225, COM 1229 and OUTB 1227 are received by peak detectors 1207 and 1217 and threshold generators and comparators block 1209. Peak detector 1207 generates PKA 1211 and peak detector 1217 generates PKB 1219. PKA 1211 and PKB 1219 are received by threshold generators and comparators block 1209 as shown in FIG. 12. Output signals OUT1-N 1215 are generated by threshold generators and comparators block 1209. With VINA being the voltage of INA 1203, VINB being the voltage of INB 1205, VIN being the differential voltage of differential signal IN and VCOM being the voltage of COM 1229, their amplitudes are related by Equations 11–12 below:

$$VINA - VINB = VIN \quad \text{(Equation 11)}$$

$$\frac{VINA + VINB}{2} = VCOM \quad \text{(Equation 12)}$$

VIN is the differential amplitude of the input signal IN and VCOM being the common mode voltage of the two differential signals. Generally, $VCOM = V_{cc}/2$. In other words, the differential input signal includes a DC common mode component VCOM and an AC differential component VIN.

Differential-to-single-ended converter 1223 converts the differential input signal IN into two single-ended signals OUTA 1225 and OUTB 1227. OUTA 1225 and OUTB 1227 are referenced to circuit ground.

Figure 13:
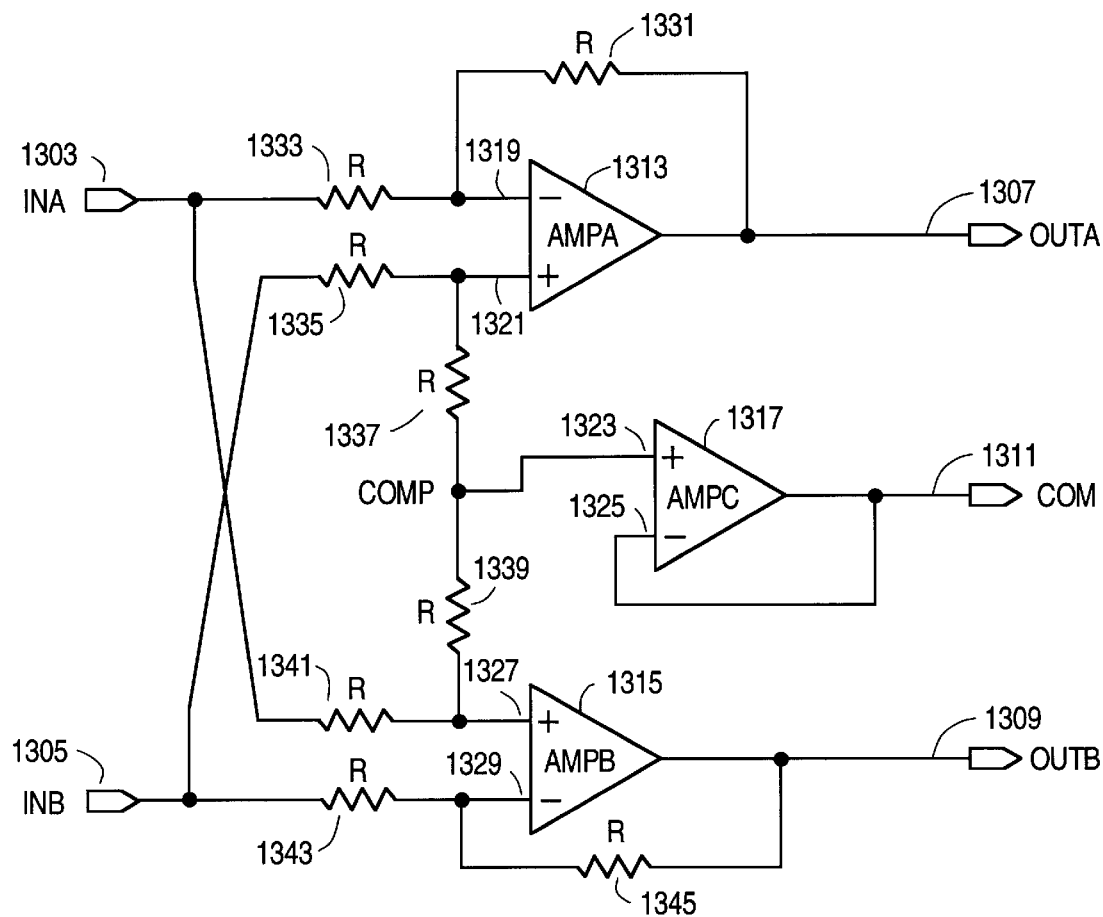
FIG. 13 is a circuit diagram of a differential-to-single-ended converter in accordance with the teachings of the present invention.

FIG. 13 is a circuit schematic of differential-to-single-ended-converter 1223 of FIG. 12. As shown in FIG. 13, INA 1303 is received at the negative input 1319 of operational amplifier 1313 and the positive input 1327 of operational amplifier 1315 through resistors 1333 and 1341 respectively. Input INB 1305 is received at the positive input 1321 of operational amplifier 1313 and the negative input 1329 of operational amplifier 1315 through resistors 1335 and 1343 respectively. Operational amplifier 1313 generates output signal OUTA 1307 and operational amplifier 1315 generates output signal OUTB 1309. The output of operational amplifier 1313 is coupled to negative input 1319 through resistor 1331 and the output of operational amplifier 1315 is coupled to negative input 1329 through resistor 1345. Operational amplifier 1317 is configured as a voltage follower buffer with its output coupled to its negative input 1325. The positive input 1323 is coupled to the positive inputs 1321 and 1327 of operational amplifiers 1313 and 1315 respectively through resistors 1337 and 1339 respectively. Voltage follower configured operational amplifier 1317 generates output signal COM 1311. In one embodiment of the present invention, the resistor values of resistors 1331, 1333, 1335, 1337, 1339, 1341, 1343 and 1345 are substantially equal.

Analysis of circuit 1301 provides VOUTA and VOUTB in accordance with Equations 13–14 below:

$$VOUTA = -\frac{1}{2} VINA + \frac{3}{2} VINB \quad \text{(Equation 13)}$$

and $$VOUTB = \frac{3}{2} VINA - \frac{1}{2} VINB \quad \text{(Equation 14)}$$

where VOUTA is the voltage at OUTA 1307, VINA is the voltage at INA 1303, VINB is the voltage at INB 1305 and VOUTB is the voltage at OUTB 1309. Equations 13 and 14 can be rewritten as $$VOUTA = -VINA + VINB + \frac{VINA}{2} + \frac{VINB}{2} \quad \text{(Equation 15)}$$

and $$VOUTB = VINA - VINB + \frac{VINA}{2} + \frac{VINB}{2} \quad \text{(Equation 16)}$$

Substituting Equations 11 and 12 into Equations 15 and 16 provides $$VOUTA = -VIN + VCOM \quad \text{(Equation 17)}$$

and $$VOUTB = VIN + VCOM \quad \text{(Equation 18)}$$

where VCOM is the voltage at COM 1311 and VIN is the differential voltage of the differential signal IN received at INA 1303 and INB 1305. Equations 17 and 18 state that OUTA 1307 and OUTB 1309 are single-ended signals. That is, OUTA 1307 and OUTB 1309 are signals that are referenced to circuit ground that include a DC common mode component (VCOM) on which is superposed an AC component (VIN).

Figure 14:
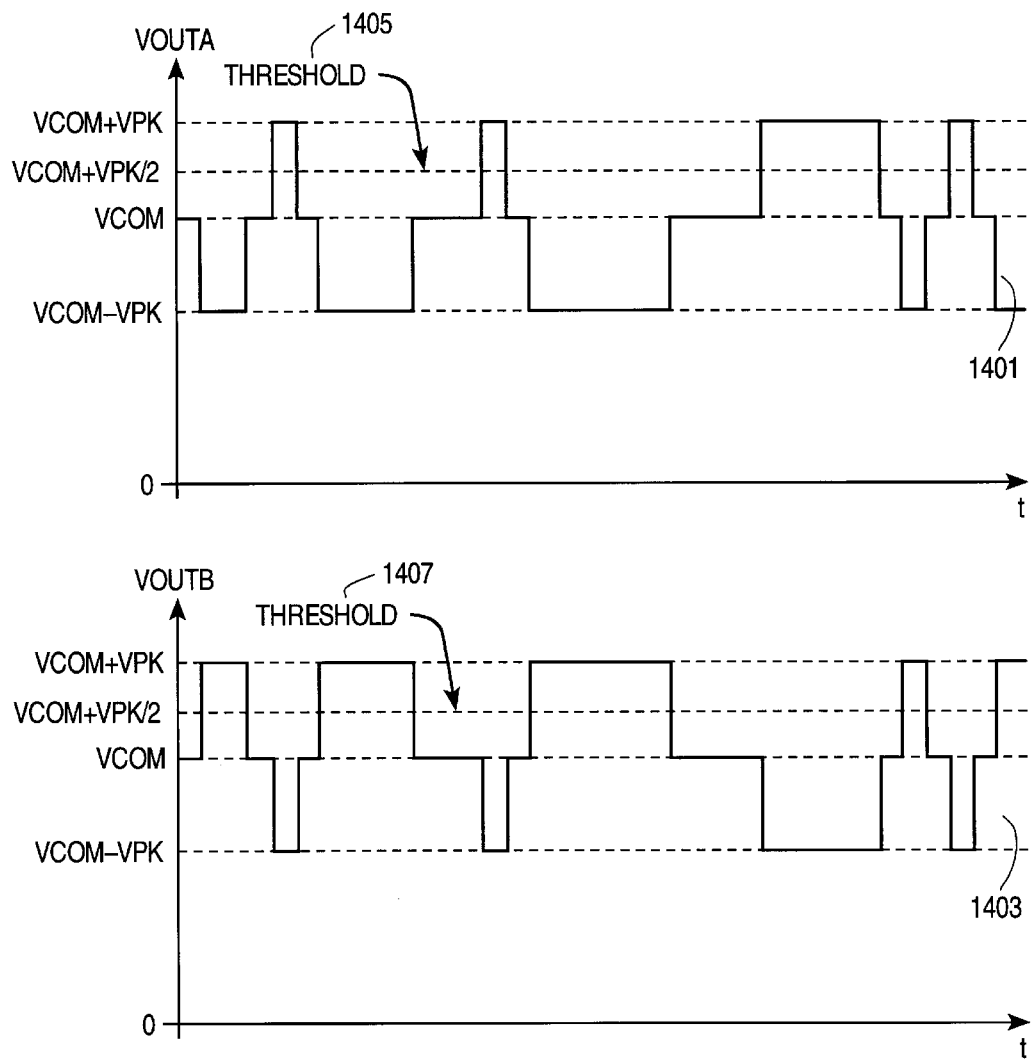
FIG. 14 is an illustration of plots illustrating output waveforms for a hypothetical three-level signaling scheme in the absence of baseline wander in accordance with the teachings of the present invention.

Equations 17 and 18 are illustrated using FIG. 14, which illustrates the output waveforms 1401 and 1403 of OUTA 1307 and OUTB 1309 respectively in the absence of baseline wander. Waveforms 1401 and 1403 are for a hypothetical three-level-signaling scheme, such as MLT-3 in the absence of baseline wander. The AC component in each waveform 1401 and 1403 is the same but of opposite polarity. Both waveforms 1401 and 1403 have peak voltages equal to VCOM+VPK, where VPK is the peak differential amplitude of differential input signal IN. The required threshold voltages 1405 and 1407 of each respective waveform are identical to each other and equal to VCOM+VPK/2 as illustrated in FIG. 14. Both peak detectors 1207 and 1217 of FIG. 12 therefore output identical DC voltages equal to VCOM+VPK at their PKA 1211 and PKB 1219 outputs respectively.

Figure 15:
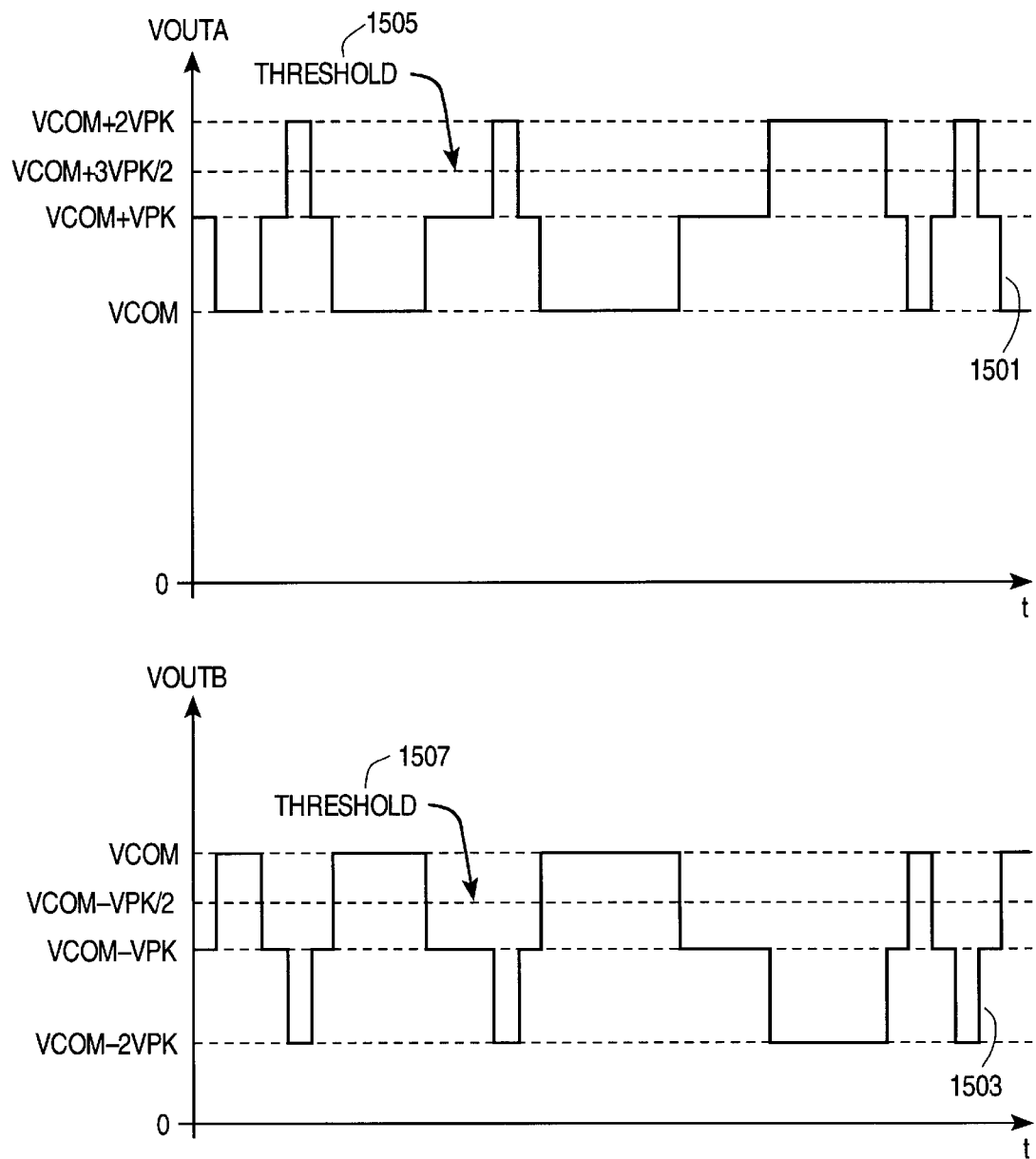
FIG. 15 is an illustration of plots of output waveforms of the present invention in the presence of severe baseline wander in accordance with the teachings of the present invention.

FIG. 15 illustrates the output waveforms 1501 and 1503 of OUTA 1307 and OUTB 1309 respectively in the presence of severe baseline wander that is equal to the full peak voltage VPK of differential input signal IN which is input at INA 1303 and INB 1305. In practice, such severe baseline wander is unlikely to occur, but it is useful for illustrating the operation of the present invention which is theoretically capable of handling such extreme cases of baseline wander. For this example, OUTA 1307 has a peak voltage of VCOM+2VPK, while OUTB 1309 has a peak voltage of VCOM. As illustrated in FIG. 15, the required threshold voltages for detecting OUTA 1307 and OUTB 1309 are VCOM+3VPK/2 and VCOM−VPK/2 respectively.

Figure 16:
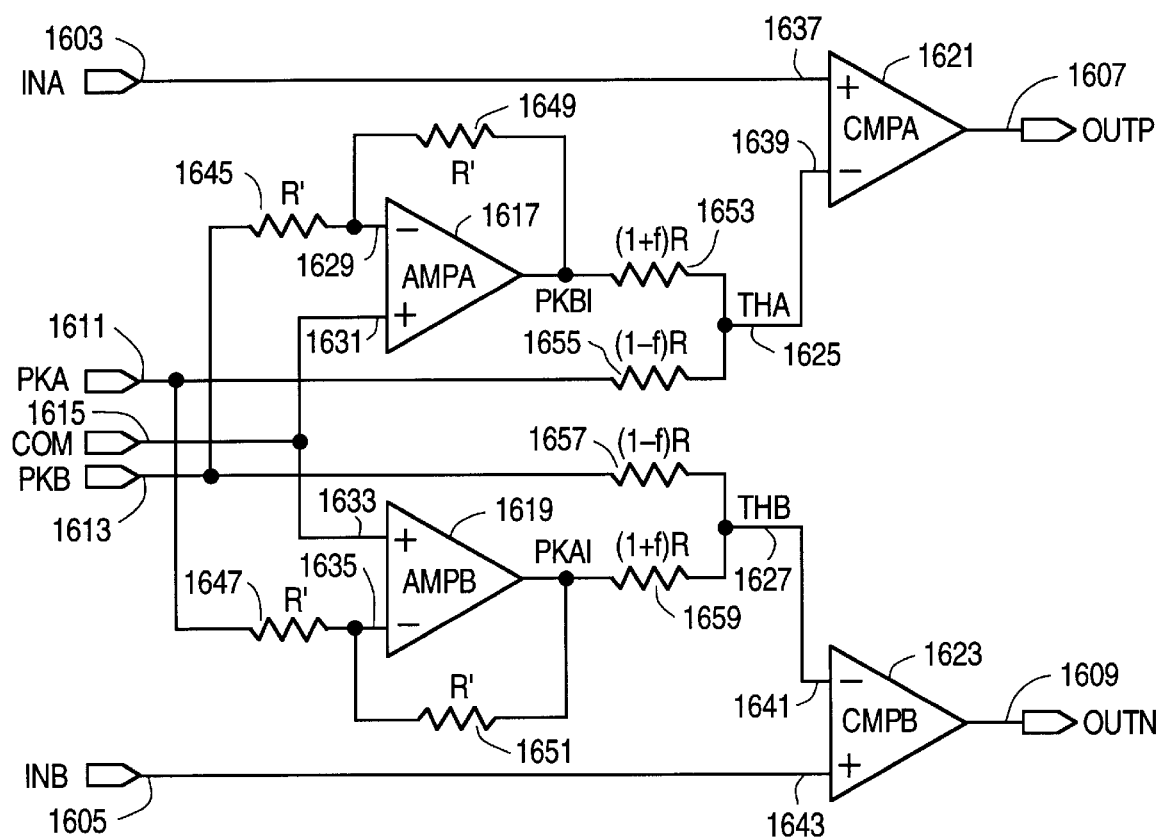
FIG. 16 is a circuit diagram of one pair of threshold generators and comparators in accordance with the teachings of the present invention.

FIG. 16 illustrates a circuit diagram 1601 of one pair of the threshold generators and comparators of threshold comparators and generators block 1209 of FIG. 12. INA 1603 is received at the positive input 1637 of comparator 1621 and INB 1605 is received at the positive input 1643 of comparator 1623. PKA 1611 is received at the negative input 1635 of operational amplifier 1619 and at the negative input 1639 of comparator 1621 through resistors 1647 and 1655 respectively. PKB 1613 is received at the negative input 1629 of operational amplifier 1617 and the negative input 1641 of comparator 1623 through resistors 1645 and 1657 respectively. COM 1615 is received at the positive input 1631 of operational amplifier 1617 and positive input 1633 of operational amplifier 1619. The output of operational amplifier 1617 is coupled to the negative input 1629 of operational amplifier 1617 and the negative input 1639 of comparator 1621 through resistors 1649 and 1653 respectively. The output of operational amplifier 1619 is coupled to the negative input 1635 of operational amplifier 1619 and the negative input 1641 of comparator 1623 through resistors 1651 and 1659 respectively.

As shown in FIG. 16, a threshold voltage is generated at the node THA 1625 between the negative input 1639 of comparator 1621 and resistors 1653 and 1655. A second threshold voltage is generated at node THB 1627 between the negative input 1641 of comparator 1623 and resistors 1657 and 1659. Output signal OUTP 1607 is generated at the output of comparator 1621 and output signal OUTN 1609 is generated at the output of comparator 1623. As shown in FIG. 16, resistors 1645, 1647, 1649 and 1651 each have resistances of R'. Resistors 1653 and 1659 have resistances of (1+f)R, while resistors 1655 and 1657 have resistance values of (1−f)R.

Each pair of threshold generators and comparators has the same inputs: INA 1603, INB 1605, PKA 1611 and PKB 1613. Each pair is also characterized by the fraction f of the peak voltage without baseline wander at which the switching threshold is located. It is appreciated that the values of R and R' are design choices and are not necessarily equal to each other.

It is also appreciated that the inputs INA 1603 and INB 1605, in contrast to circuits 601, 901 and 1001 of FIGS. 6, 9 and 10 respectively are completely unattenuated. Therefore, the signal-to-noise ratio of the comparators is maximized.

The input peak voltages from the peak detectors are inverted by the operational amplifiers 1617 and 1619. The outputs of the operational amplifiers are given by Equations 19–20 below:

$$VPKAI = -VPKA + 2VCOM \qquad \text{(Equation 19)}$$

and $$VPKBI = -VPKB + 2VCOM \qquad \text{(Equation 20)}$$

where VPKAI is the voltage at the output of operational amplifier 1619, VPKA is the voltage at PKA 1611, VCOM is the voltage at COM 1615, VPKBI is the voltage at the output of operational amplifier 1617 and VPKB is the voltage at PKB 1613. The threshold voltages VTHA and VTHB at nodes THA 1625 and THB 1627 respectively which are input to the negative inputs 1639 and 1641 of comparators 1621 and 1623 respectively are given by $$VTHA = \frac{(1+f)}{2} VPKA + \frac{(1-f)}{2} VPKBI \qquad \text{(Equation 21)}$$

and $$VTHB = \frac{(1+f)}{2} VPKB + \frac{(1-f)}{2} VPKAI \qquad \text{(Equation 22)}$$

substituting Equations 19 and 20 into Equations 21 and 22 results in $$VTHA = \frac{(1+f)}{2} VPKA - \frac{(1-f)}{2} VPKB + (1-f)VCOM \qquad \text{(Equation 23)}$$

and $$VTHB = \frac{(1+f)}{2} VPKB - \frac{(1-f)}{2} VPKA + (1-f)VCOM \qquad \text{(Equation 24)}$$

To illustrate threshold generation in a three-level-signaling scheme such as MLT-3 with no baseline wander, VPKA and VPKB are both equal to (VCOM+VPK) as shown in FIG. 14. In addition, f=½ for both thresholds. Then from Equations 23 and 24 the thresholds are given by Equations 25–26 below:

$$VTHA = \frac{3}{4} VPKA - \frac{1}{4} VPKB + \frac{1}{2} VCOM \qquad \text{(Equation 25)}$$

and $$VTHB = \frac{3}{4} VPKB - \frac{1}{4} VPKA + \frac{1}{2} VCOM \qquad \text{(Equation 26)}$$

Substituting VPKA=VPKB=(VCOM+VPK) into Equations 25 and 26, the following results are obtained for VTHA and VTHB as shown in FIG. 14.

$$VTHA = \frac{VPK}{2} + VCOM \qquad \text{(Equation 27)}$$

$$VTHB = \frac{VPK}{2} + VCOM \qquad \text{(Equation 28)}$$

For the example of extreme baseline wander, in which VPKA=(VCOM+2VPK) and VPKB=VCOM, Equations 23 and 24 provide the following results for VTHA and VTHB as shown in FIG. 15.

$$VTHA = \frac{3}{2} VPK + VCOM \qquad \text{(Equation 29)}$$

$$VTHB = -\frac{VPK}{2} + VCOM \qquad \text{(Equation 30)}$$

It is appreciated that the circuitry that generates OUTP 1607 is applicable for all positive thresholds and to a threshold of 0 volts and is not limited only to a single output. Similarly, the circuitry that generates OUTN 1609 is applicable for all negative thresholds and to a threshold of 0 volts and is not limited only to a single output. The only difference between the circuitry of each threshold is the fraction f, which is different for each threshold.

Circuit schematic 1601 may also be modified to accommodate differential signals with N equal to an even number. That is, N is not limited to being equal to three. In the instances with N equal to an even number, there will be a threshold level at zero volts. If the particular signaling scheme has an even number of levels, then one pair of threshold generators-comparators will be degenerate. That is, one pair of threshold generators and comparators of a circuit such as circuit 1601 of FIG. 16 will have the exact same thresholds and outputs. This is because a signaling scheme with an even number of levels has one threshold (without baseline wander) located at 0 volts, which corresponds to f=0. Thus, only a single threshold generator-comparator pair is required for f=0. The Equation for the threshold for f=0 for signal OUTA 1225 of FIG. 12 is obtained by substituting f=0 into Equation 23 above which returns Equation 31 below for VTH:

$$VTH = \frac{VPKA - VPKB}{2} + VCOM \qquad \text{(Equation 31)}$$

Similarly, the equation for the threshold for f=0 for signal OUTB 1227 of FIG. 12 is obtained by substituting f=0 into equation 24 above which gives for VTH:

$$VTH = \frac{VPKB - VPKA}{2} + VCOM \qquad \text{(Equation 32)}$$

Since only a single comparator is required for f=0, it is a design choice whether to implement Equation 31 or Equation 32. For considerations of load matching on signals OUTA 1225 and OUTB 1227, both Equations 31 and 32 should be implemented, with one of the two comparators left unconnected.

Figure 17:
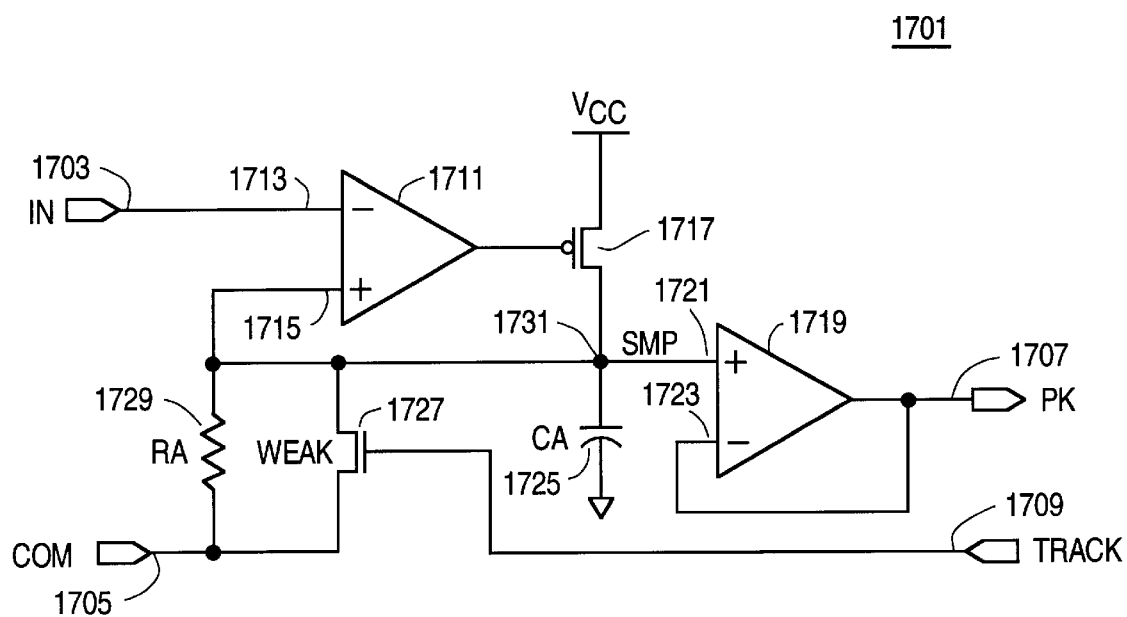
FIG. 17 is a circuit diagram of another embodiment of a peak detector in accordance with the teachings of the present invention.

FIG. 17 is a circuit diagram 1701 of one embodiment of a peak detector such as peak detector 1207 or 1217 of FIG. 12. Input signal IN 1703 is received at the negative input 1713 of comparator 1711. Input signal COM 1705 is coupled to the positive input 1715 of comparator 1711 through resistor 1729 having a resistance RA. COM 1705 is also coupled to node SMP 1731 through n-channel transistor 1727. The gate of weak n-channel transistor 1727 is coupled to input signal TRACK 1709. Capacitor 1725 having a capacitance of CA is coupled between ground and node SMP 1731. P-channel transistor 1717 is coupled between node SMP 1731 and VCC. The gate of p-channel transistor 1717 is coupled to the output of comparator 1711. Operational amplifier 1719 is configured as a voltage follower to buffer the voltage at node SMP 1731 with the positive input 1721 of operational amplifier 1719 coupled to node SMP 1731. The output of operational amplifier 1719 is coupled to negative input 1723. Operational amplifier 1719 generates output signal PK 1707.

As shown in FIG. 17, node SMP 1731 stores the peak voltage of input IN 1703 on capacitor 1725. The voltage at node SMP 1731 appears at the output PK 1707. In one embodiment of the present invention, a large resistor 1729 slowly discharges the voltage at node SMP 1731 with the time constant RA x CA towards the voltage at COM 1705. This discharge is necessary in order to discharge any high voltages at node SMP 1731 that may exist before the start of operation. If the voltage at node SMP 1731 is too high, the corresponding threshold voltage, which is derived from node SMP 1731, would be too high to allow signal detection by the comparators in the last stage.

During baseline wander it is necessary to track the droop of long pulses. This tracking is necessary in order for the comparator thresholds to track baseline wander. In one embodiment of the present invention, n-channel transistor 1727 is a weak MOS device in parallel with capacitor 1725 to provide a short time constant to allow tracking. N-channel transistor 1727 discharges the voltage at node SMP 1731 towards the voltage at COM 1705. N-channel transistor 1727 is activated by the input signal TRACK 1709 which is active whenever one of the output signals triggered by IN 1703 goes active. Therefore, the lowest threshold signal triggered by OUTA 1225 in FIG. 12 begins discharging node SMP 1731 in peak detector 1207 while the lowest threshold signal triggered by OUTB 1227 in FIG. 12 begins discharging the node SMP 1731 in the peak detector 1217. Similar to the peak detector circuit 1101 of FIG. 11, it is appreciated that circuit 1701 can also be characterized as simply a charge/discharge circuit charging capacitor 1725 to the peak voltage at IN 1703 and discharging the voltage on capacitor 1725 when that voltage is higher than the peak voltage at IN 1703.

Thus, what has been described is a method and an apparatus for sensing and detecting differential threshold levels of a differential signal being carried in first and second lines while compensating for baseline wander. With the presently described sensing method and circuit, neither feedback nor precision amplitude control of any kind is required. Furthermore, the presently described sensing method and circuit does not rely on precision components, but rather only on resistor ratios, which are readily implemented with high precision.

In the foregoing detailed description, the method and apparatus of the present invention has been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A sensing circuit for detecting differential threshold levels of a differential signal being carried in first and second lines, comprising:

a first peak detector circuit coupled to the first and second lines, the first peak detector circuit detecting first and second peak voltages in the differential signal and generating first and second peak signals; and, a resistor network/comparator circuit coupled to the first and second lines and the first and second peak signals, the resistor network/comparator circuit generating a first output signal indicating a first differential threshold level of the differential signal;

wherein the differential signal transitions between N different voltage levels wherein N is an integer greater than one, the resistor network/comparator circuit generating N-1 output signals, each one of the N-1 output signals corresponding to a differential threshold level between two of the N different voltage levels.

2. The sensing circuit described in claim 1 wherein the differential signal transitions between three different voltage levels, the resistor network/comparator circuit generating the first output signal and a second output signal, the resistor network/comparator circuit comprising:

a first comparator generating the first output signal, the first line coupled to a first input of the first comparator through a first resistor, the second peak signal coupled to the first input of the first comparator through a second resistor, the first peak signal coupled to a second input of the first comparator through a third resistor, the second line coupled to the second input of the first comparator through a fourth resistor; and, a second comparator generating the second output signal, the second line coupled to a first input of the second comparator through a fifth resistor, the second peak signal coupled to the first input of the second comparator through a sixth resistor, the first peak signal coupled to a second input of the second comparator through a seventh resistor, the first line coupled to the second input of the second comparator through an eighth resistor.

3. The sensing circuit described in claim 2 wherein the first, fourth, fifth and eighth resistors have a first resistance equal to R and the second, third, sixth and seventh resistors have a second resistance equal to 2R.

4. A sensing circuit for detecting differential threshold levels of a differential signal being carried in first and second lines, comprising:

a first peak detector circuit coupled to the first and second lines, the first peak detector circuit detecting first and second peak voltages in the differential signal and generating first and second peak signals;

a resistor network/comparator circuit coupled to the first and second lines and the first and second peak signals, the resistor network/comparator circuit generating a first output signal indicating a first differential threshold level of the differential signal; and a second peak detector circuit coupled to the first and second lines, the second peak detector circuit detecting third and fourth peak voltages in the differential signal and generating third and fourth peak signals, the resistor network/comparator circuit further coupled to the third and fourth peak signals.

5. The sensing circuit described in claim 4 wherein the differential signal transitions between N different voltage levels wherein N is an integer greater than one, the resistor network/comparator circuit generating N-1 output signals, each one of the N-1 output signals corresponding to a differential threshold level between two of the N different voltage levels.

6. The sensing circuit described in claim 4 wherein the first peak detector circuit outputs and tracks a peak positive amplitude of the differential signal and the second peak detector circuit outputs and tracks a peak negative amplitude of the differential signal such that the sensing circuit compensates for baseline wander in the differential signal.

7. The sensing circuit described in claim 6 wherein the resistor network/comparator circuit comprises a first comparator generating the first output signal, the first line coupled to a first input of the first comparator through a first resistor, the second peak signal coupled to the first input of the first comparator through a second resistor, the fourth peak signal coupled to the first input of the first comparator through a third resistor, the third peak signal coupled to a second input of the first comparator through a fourth resistor, the first peak signal coupled to the second input of the first comparator through a fifth resistor, the second line coupled to the second input of the first comparator through a sixth resistor.

8. The sensing circuit described in claim 7 wherein the first output signal corresponds to a differential threshold level approximately equal to a fraction f of the first peak voltage, wherein the first and sixth resistors have a first resistance equal to R, the second and fifth resistors have a second resistance equal to $2R/(1+f)$ and the third and fourth resistors have a third resistance equal to $2R/(1-f)$.

9. The sensing circuit described in claim 6 wherein the resistor network/comparator circuit comprises a second comparator generating a second output signal, the second line coupled to a first input of the second comparator through a seventh resistor, the third peak signal coupled to the first input of the second comparator through an eighth resistor, the first peak signal coupled to the first input of the second comparator through a ninth resistor, the second peak signal coupled to a second input of the second comparator through a tenth resistor, the fourth peak signal coupled to the second input of the second comparator through an eleventh resistor, the first line coupled to the second input of the second comparator through a twelfth resistor.

10. The sensing circuit described in claim 9 wherein the second output signal corresponds to a differential threshold level approximately equal to a fraction f of the second peak voltage, wherein the seventh and twelfth resistors have a fourth resistance equal to R, the eighth and eleventh resistors have a fifth resistance equal to $2R/(1+f)$ and the ninth and tenth resistors have a sixth resistance equal to $2R/(1-f)$.

11. A sensing circuit for detecting differential threshold levels of a differential signal being carried in first and second lines, comprising:

a first peak detector circuit coupled to the first and second lines, the first peak detector circuit detecting first and second peak voltages in the differential signal and generating first and second peak signals;

a resistor network/comparator circuit coupled to the first and second lines and the first and second peak signals, the resistor network/comparator circuit generating a first output signal indicating a first differential threshold level of the differential signal;

wherein the first peak detector circuit comprises:

a charge/discharge circuit coupled to the first and second lines;

a first capacitor charged by the charge/discharge circuit to the first peak voltage, the first peak voltage being approximately equal to a peak positive voltage of the first line; and, a second capacitor discharged by the charge/discharge circuit to the second peak voltage in the differential signal, the second peak voltage being approximately equal to a peak negative voltage of the second line.

12. The sensing circuit described in claim 11 wherein the first peak detector circuit further comprises a track input coupled to the charge/discharge circuit, the charge/discharge circuit reducing a time constant of the first and second capacitors in response to the track input.

13. A method for detecting differential threshold levels of a differential signal being carried in first and second lines, comprising the steps of:

detecting first and second peak positive voltages of the differential signal;

detecting first and second peak negative voltages of the differential signal;

generating a positive differential threshold output signal in response to the first and second lines, the first and second peak positive voltages and the first and second peak negative voltages; and, generating a negative differential threshold output signal in response to the first and second lines, the first and second peak positive voltages and the first and second peak negative voltages.

14. The method described in claim 13 wherein the step of generating the positive differential threshold output signal includes the step of comparing the first line, the first peak negative voltage and the second peak positive voltage with the second peak negative voltage, first peak positive voltage and the second line to generate the positive differential threshold output signal.

15. The method described in claim 13 wherein the step of generating the negative differential threshold output signal includes the step of comparing the second line, the second peak negative voltage and the first peak positive voltage with the first peak negative voltage, second peak positive voltage and the first line to generate the negative differential threshold output signal.

16. The method described in claim 13 including the additional step of tracking baseline wander in the differential signal in response to a lowest positive differential threshold output signal.

17. The method described in claim 13 including the additional step of tracking baseline wander in the differential signal in response to a lowest negative differential threshold output signal.

18. A sensing circuit for detecting differential threshold levels of a differential signal being carried in first and second lines, comprising:

a converter circuit coupled to the first and second lines, the converter circuit generating first and second single-ended signals and a common mode signal;

a first peak detector circuit coupled to the first single-ended signal and the common mode signal, the first peak detector circuit generating a first peak signal;

a second peak detector circuit coupled to the second single-ended signal and the common mode signal, the second peak detector circuit generating a second peak signal; and, a comparing circuit coupled to the first and second single-ended signals, the first and second peak signals and the common mode signal, the comparing circuit generating a first output signal indicating a first differential threshold level of the differential signal.

19. The sensing circuit described in claim 18 wherein the differential signal transitions between N different voltage levels wherein N is an integer greater than one, the comparing circuit generating N-1 output signals, each one of the N-1 output signals corresponding to a differential threshold level between two of the N different voltage levels.

20. The sensing circuit described in claim 18 wherein the converter circuit comprises:

a first operational amplifier coupled to the first and second lines, the first operational amplifier generating the first single-ended signal;

a second operational amplifier coupled to the first and second lines, the second operational amplifier generating the second singled-ended signal; and, a third operational amplifier coupled the first and second lines, the third operational amplifier generating the common mode signal.

21. The sensing circuit described in claim 20 wherein the converter circuit further comprises:

a first resistor coupled between the first line and a second input of the first operational amplifier;

a second resistor coupled between the second line and a first input of the first operational amplifier;

a third resistor coupled between the first line and a input of the second operational amplifier;

a fourth resistor coupled between the second line and a second input of the second operational amplifier;

a fifth resistor coupled between a first input of the third operational amplifier and the first input of the first operational amplifier;

a sixth resistor coupled between the first input of the third operational amplifier and the first input of the second operational amplifier;

a seventh resistor coupled between an output of the first operational amplifier and the second input of the first operational amplifier; and an eighth resistor coupled between an output of the second operational amplifier and the second input of the second operational amplifier, wherein resistor values of the first, second, third, fourth, fifth, sixth, seventh and eighth resistors are substantially equal.

22. The sensing circuit described in claim 18 wherein the comparing circuit comprises:

a fourth operational amplifier having a first input coupled to the second peak signal, a second input of the fourth operational amplifier coupled to the common mode signal;

a fifth operational amplifier having a first input coupled to the first peak signal, a second input of the fifth operational amplifier coupled to the common mode signal;

a first comparator having a first input coupled to the first single-ended signal, a second input of the first comparator coupled to an output of the fourth operational amplifier and the first peak signal; and, a second comparator having a first input coupled to the second single-ended signal, a second input of the second comparator coupled to an output of the fifth operational amplifier and the second peak signal.

23. The sensing circuit described in claim 22 wherein the comparing circuit further comprises:

a ninth resistor coupled between the second input of the first comparator and the output of the fourth operational amplifier;

an eleventh resistor coupled between the second input of the second comparator and the output of the fifth operational amplifier, the ninth and eleventh resistors having a resistance equal to (1+f)R;

a tenth resistor coupled between the second input of the first comparator and the first peak signal;

a twelfth resistor coupled between the second input of the second comparator and the second peak signal, the tenth and twelfth resistors having a resistance equal to (1−f)R;

a thirteenth resistor coupled between the first input of the fourth operational amplifier and the second peak signal;

a fourteenth resistor coupled between the first input of the fifth operational amplifier and the first peak signal;

a fifteenth resistor coupled between the output and the first input of the fourth operational amplifier; and a sixteenth resistor coupled between the output and the first input of the fifth operational amplifier wherein the thirteenth, fourteenth, fifteenth and sixteenth resistors have a resistance equal to R'.

24. The sensing circuit described in claim 18 wherein the first output signal corresponds to a differential threshold level approximately equal to a fraction f of a first peak voltage, the first peak voltage being approximately equal to a peak positive voltage of the first single-ended signal.

25. The sensing circuit described in claim 18 wherein the first peak detector circuit comprises:

a first charge/discharge circuit coupled to the first singled-ended signal and the common mode signal; and, a first capacitor charged by the first charge/discharge circuit to the first peak voltage, the first peak voltage being approximately equal to the peak voltage of the first single-ended signal.

26. The sensing circuit described in claim 25 wherein the first peak detector circuit further comprises a first track input coupled to the first charge/discharge circuit, the first charge/discharge circuit reducing a first charge/discharge time constant in response to the first track input.

27. The sensing circuit described in claim 18 wherein the second peak detector circuit comprises:

a second charge/discharge circuit coupled to the second single-ended signal and the common mode signal; and, a second capacitor charged by the second charge/discharge circuit to a second peak voltage, the second peak voltage being approximately equal to a peak voltage of the second single-ended signal.

28. The sensing circuit described in claim 27 wherein the first peak detector circuit further comprises a second track input coupled to the second charge/discharge circuit, the second charge/discharge circuit reducing a second charge/discharge time constant in response to the second track input.

29. A method for detecting differential threshold levels of a differential signal being carried in first and second lines, comprising the steps of:

generating first and second single-ended signals in response to the first and second lines;

generating a common mode signal in response to the first and second lines;

detecting a first peak signal in response to the first single-ended signal and the common mode signal;

detecting a second peak signal in response to the second single-ended signal and the common mode signal;

generating a first output signal indicating a first differential threshold level of the differential signal in response to the first single-ended signal, the first and second peak signals and the common mode signal; and, generating a second output signal indicating a second differential threshold level of the differential signal in response to the second single-ended signal, the first and second peak signals and the common mode signal.

30. The method described in claim 29 wherein the steps of generating the first and second output signals comprise the steps of:

generating a first threshold signal in response to the second peak signal, the common mode signal and the first peak signal;

generating a second threshold signal in response to the first peak signal, the common mode signal and the second peak signal;

generating the first output signal by comparing the first single-ended signal with the first threshold signal; and generating the second output signal by comparing the second single-ended signal with the second threshold signal.

* * * * *